United States Patent
Inui

(10) Patent No.: US 8,427,558 B2
(45) Date of Patent: Apr. 23, 2013

(54) IMAGE PICKUP APPARATUS

(75) Inventor: Fumihiro Inui, Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 347 days.

(21) Appl. No.: 12/652,276

(22) Filed: Jan. 5, 2010

(65) Prior Publication Data

US 2010/0128151 A1     May 27, 2010

Related U.S. Application Data

(62) Division of application No. 10/958,056, filed on Oct. 4, 2004, now Pat. No. 7,688,365, which is a division of application No. 09/791,546, filed on Feb. 26, 2001, now Pat. No. 6,801,255.

(30) Foreign Application Priority Data

Feb. 29, 2000   (JP) ................................. 2000-054137

(51) Int. Cl.
*H04N 5/217*     (2011.01)
*H04N 3/14*     (2006.01)
*H04N 5/335*     (2011.01)

(52) U.S. Cl.
USPC ........................... 348/241; 348/272; 348/308

(58) Field of Classification Search .................. 348/241, 348/272, 308
See application file for complete search history.

(56) References Cited

U.S. PATENT DOCUMENTS

| | | | |
|---|---|---|---|
| 5,446,493 A | 8/1995 | Endo et al. | |
| 5,491,566 A * | 2/1996 | Oh et al. | 358/472 |
| 5,786,588 A | 7/1998 | Takahashi | |
| 5,790,191 A | 8/1998 | Zhang | |
| 5,841,126 A * | 11/1998 | Fossum et al. | 250/208.1 |
| 5,892,540 A | 4/1999 | Kozlowski | 348/300 |
| 5,969,758 A | 10/1999 | Sauer et al. | 348/241 |
| 5,998,779 A | 12/1999 | Kozuka | |
| 6,091,449 A | 7/2000 | Matsunaga et al. | 348/308 |
| 6,157,407 A | 12/2000 | Kobayashi | |
| 6,166,767 A | 12/2000 | Watanabe | 348/301 |
| 6,166,768 A * | 12/2000 | Fossum et al. | 348/308 |
| 6,175,126 B1 | 1/2001 | West | |

(Continued)

FOREIGN PATENT DOCUMENTS

| | | |
|---|---|---|
| JP | 1-279681 | 11/1989 |
| JP | 2-107075 | 4/1990 |

(Continued)

OTHER PUBLICATIONS

Japanese Office Action dated Mar. 27, 2000 in Japanese Patent 4,227,274 (corresponding to Japanese Patent Application 2000-054138, laid-open at Japan 2001-245221) and excerpted translation thereof.

*Primary Examiner* — Trung Diep
(74) *Attorney, Agent, or Firm* — Fitzpatrick, Cella, Harper & Scinto

(57) ABSTRACT

There is provided an image pickup apparatus comprising two-dimensionally arrayed pixels, a plurality of read-out channels each including a read-out circuit and an amplifier circuit, a parallel-serial conversion circuit which sequentially selects pixel signals output via the plurality of read-out channels and outputs a series of pixel signals, and a clamp unit which clamps the reset level included in an output signal from the read-out circuit in order to remove an offset generated in each read-out channel.

5 Claims, 15 Drawing Sheets

U.S. PATENT DOCUMENTS

| | | |
|---|---|---|
| 6,466,265 B1 | 10/2002 | Lee et al. |
| 6,512,546 B1 | 1/2003 | Decker et al. |
| 6,534,757 B2 | 3/2003 | Inui et al. |
| 6,549,235 B1 * | 4/2003 | Fossum et al. ............... 348/308 |
| 6,665,588 B2 | 12/2003 | Watanabe et al. |
| 6,803,952 B1 | 10/2004 | Watanabe |
| 6,999,120 B1 | 2/2006 | Egawa et al. ............... 348/296 |
| 2001/0030701 A1 | 10/2001 | Hiyama et al. |
| 2002/0051229 A1 | 5/2002 | Eguchi et al. |
| 2002/0145668 A1 | 10/2002 | Harada |
| 2004/0012684 A1 | 1/2004 | Tinnerino |

FOREIGN PATENT DOCUMENTS

| | | |
|---|---|---|
| JP | 4227274 | 8/1992 |
| JP | 8-102893 | 4/1996 |
| JP | 8-163311 | 6/1996 |
| JP | 10-173997 | 6/1998 |
| JP | 11-331709 | 11/1999 |
| JP | 2001-111900 | 4/2001 |
| JP | 2001-245221 | 9/2001 |
| JP | 2002-511215 | 4/2002 |
| WO | 97/07630 | 2/1997 |

* cited by examiner

IMAGE PICKUP APPARATUS

This is a divisional of co-pending U.S. patent application Ser. No. 10/958,056, filed Oct. 4, 2004, which is a divisional of U.S. Pat. No. 09/791,546, filed Feb. 26, 2001, now U.S. Pat. No. 6,801,225.

BACKGROUND OF THE INVENTION

1. Field of the Invention

The present invention relates to a semiconductor solid-state image pickup device having pixels two-dimensionally arrayed on a single semiconductor substrate, and an image pickup apparatus using the semiconductor solid-state image pickup device.

2. Related Background Art

In recent image input devices such as a digital still camera and digital video camera, the number of pixels of a sensor formed from a photoelectric conversion element is increasing to obtain a high quality-image. Demands have thus arisen for small pixel size and short read-out time. To meet these demands, a method of dividing a pixel signal in accordance with a plurality of read-out channels and reading out the signals has been developed.

This conventional method will be described with reference to FIGS. 1 and 2. FIG. 1 is a circuit diagram showing a schematic arrangement according to the conventional method. In FIG. 1, each of two-dimensionally arrayed pixels 101 generates an electrical signal, e.g., so-called pixel signal corresponding to the incident light quantity. This pixel signal is read out by selecting one row by a vertical scanning circuit 102, reading out signals of odd-numbered pixels on the row to a line memory circuit 104, and reading out signals of even-numbered pixels on the row to a line memory circuit 109.

A horizontal scanning circuit 105 sequentially selects pixel signals read out to the line memory circuit 104 in accordance with a horizontal shift pulse 122 externally or internally input in the chip. The selected pixel signals are amplified by an amplifier 107, and output via an output 108. A horizontal scanning circuit 110 sequentially selects pixel signals read out to the line memory circuit 109 in accordance with a horizontal shift pulse 123 externally or internally input in the chip. The selected pixel signals are amplified by an amplifier 112, and output via an output 113.

One terminal of a switch 116 is connected to the terminal of the output 108, whereas one terminal of a switch 117 is connected to the terminal of the output 113. The other terminal of the switch 116 is connected to that of the switch 117. The switches 116 and 117 are alternately selected to output, from an output 120, pixel signals arranged in a time series by combining odd- and even-numbered lines.

The two-dimensionally arrayed pixels 101 include OB (Optical Black) pixels shielded from light by a light-shielding layer or the like, and effective pixels not covered by any light-shielded layer. A dark-level signal output from an OB pixel to the output 108 is clamped to a desired potential using a clamp unit 124, and a dark-level signal output from an OB pixel to the output 113 is clamped to a desired potential using a clamp unit 125. If the potentials clamped by the respective clamp units are the same, an output signal from which an offset is removed can be obtained from the output 120.

FIG. 2 is a timing chart at the seven nodes of the horizontal shift pulse 122, horizontal shift pulse 123, output 108, output 113, switch 116, switch 117, and output 120. FIG. 2 shows clamp periods 1 and 2 during which clamp operation is done.

FIG. 2 shows six clocks of each of the horizontal shift pulses 122 and 123 respectively input to the horizontal scanning circuits 105 and 110. Timings corresponding to pixel signals of pixels from the first row to the 12th row are assigned a to l. The pixel signals a to f are dark-level signals obtained from OB pixels, and g to l are pixel signals obtained from effective pixels.

As shown in FIG. 2, the pixel signals a, c, e, g, i, and k synchronized with the horizontal shift pulse 122 are sequentially output to the output 108, and the pixel signals b, d, f, h, j, and l synchronized with the horizontal shift pulse 123 are sequentially output to the output 113. When the outputs 108 and 113 output dark-level signals, the clamp units 124 and 125 operate to clamp the dark-level signals to desired potentials. Then, the switches 116 and 117 are alternately selected to output the pixel signals a, b, c, d, e, f, g, h, i, j, k, and l to the output 120 in the order named.

As is apparent from FIG. 2, the clock rates of the outputs 108 and 113 suffice to be ½ that of the output 120, and the read-out time can be relatively easily shortened. With a plurality of read-out channels, the line memory circuit is connected at a pitch corresponding to two pixels. In reducing the pixel size, pixels can be easily wired to the line memory circuit. The clamp units 124 and 125 can remove offsets for respective read-out channels, and a high-quality image signal can be attained.

As described above, a conventional pixel signal is divided in accordance with a plurality of read-out channels, offsets of the read-out channels are removed by clamping dark-level signals among pixel signals, and output signals for the respective read-out channels are sequentially selected and output in time series. This method, however, requires OB pixels as a means for clamping offsets, and this increases the layout. The clamp period increases the read-out time. In addition, this method suffers variations in clamp level due to variations in dark level caused by defective OB pixels, stray light, or the like.

SUMMARY OF THE INVENTION

It is an object of the present invention to obtain a high-quality image by accurately removing an offset generated between a plurality of channels.

To achieve the above object, according to an aspect of the present invention, there is provided an image pickup apparatus comprising two-dimensionally arrayed pixels, a plurality of read-out channels each including a read-out circuit adapted to read out signals from the pixels and an amplifier circuit, a parallel-serial conversion circuit adapted to sequentially select pixel signals output via the plurality of read-out channels and output a series of pixel signals, and a clamp unit adapted to clamp a reset level included in an output signal from the read-out circuit in order to remove an offset generated in each read-out channel.

According to another aspect of the present invention, there is provided an image pickup apparatus comprising two-dimensionally arrayed pixels, a plurality of read-out channels each including a line memory circuit adapted to hold signals from pixels of one line and an amplifier circuit, a vertical scanning circuit adapted to divide and transfer signals from the plurality of pixels to the line memory circuits, a plurality of horizontal scanning circuits adapted to output signals from the line memory circuits via corresponding amplifier circuits, a parallel-serial conversion circuit adapted to sequentially select pixel signals output from the plurality of read-out channels and output a series of pixel signals, and a clamp unit adapted to clamp a reset level included in an output signal from each read-out channel in order to remove an offset generated in each read-out channel.

These arrangements can attain the following technological advantages.

(1) No OB pixel needs to be used.
(2) A period necessary for the clamp unit can be shortened.
(3) A stable clamp level can be supplied against variations in dark level caused by defective OB pixels, stray light, or the like, and a noise component can be effectively removed.

The above and other objects and features of the present invention will be apparent from the following description in conjunction with the accompanying drawings.

DETAILED DESCRIPTION OF THE PREFERRED EMBODIMENTS

The first embodiment according to the present invention will be described with reference to FIGS. 3 and 4.

Figure 3:
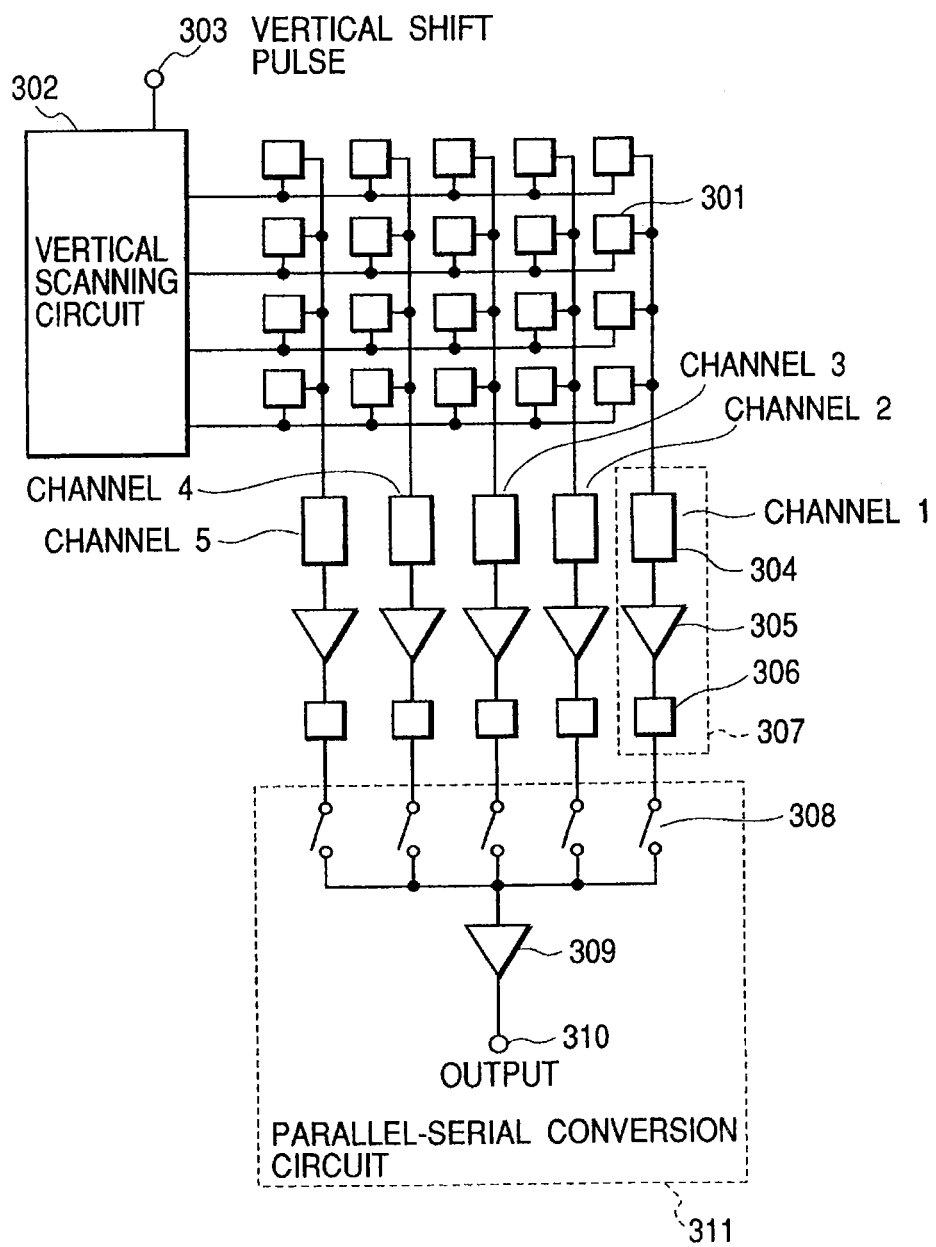
FIG. 3 is a circuit diagram schematically showing the first to eighth embodiments of a solid-state image pickup device according to the present invention.

FIG. 3 is a circuit diagram showing the schematic arrangement of a solid-state image pickup device formed on a single semiconductor substrate according to the first embodiment. In FIG. 3, two-dimensionally arrayed pixels 301 generate so-called pixel signals corresponding to incident light quantities. A given row is selected by a vertical scanning circuit 302 in accordance with a vertical shift pulse 303 externally or internally input in the chip, and the pixel signals are read out to read-out channels 1 to 5 connected to pixels on the selected row. On each read-out channel 307, the pixel signal is held by a read-out circuit 304 made up of a line memory circuit, correlation double sampling (CDS) circuit, and the like, subjected to signal amplification and offset correction by an amplifier 305 and clamp unit 306 on the output stage, and output.

One terminal of each switch 308 is connected to the output of a corresponding read-out channel 307, and the other terminal is serially-connected to those of the remaining switches 308. By sequentially selecting the switches 308, image signals arranged in a time series and line-sequentially are output from an output 310 via an output buffer circuit 309. The read-out circuit 304 resets a pixel signal to prevent mixing of pixel signals such as an afterimage every time sequentially read-out pixel signals are transferred to the subsequent amplifier. The reset voltage is externally input or internally generated, and a reset level including only the offset of the read-out channel is output without any influence of the pixel signal.

The reset level included in an output signal after the read-out circuit 304 of channel 1 is clamped to a desired potential using the clamp unit 306 of channel 1. The reset level included in an output signal after the read-out circuit 304 of channel 2 is clamped to a desired potential using the clamp unit 306 of channel 2. The reset level included in an output signal after the read-out circuit 304 of channel 3 is clamped to a desired potential using the clamp unit 306 of channel 3. The reset level included in an output signal after the read-out circuit 304 of channel 4 is clamped to a desired potential using the clamp unit 306 of channel 4. The reset level included in an output signal after the read-out circuit 304 of channel 5 is clamped to a desired potential using the clamp unit 306 of channel 5.

If the potentials clamped by the clamp units 306 are the same, an output signal free from any offset can be obtained from the output 310.

Figure 1:
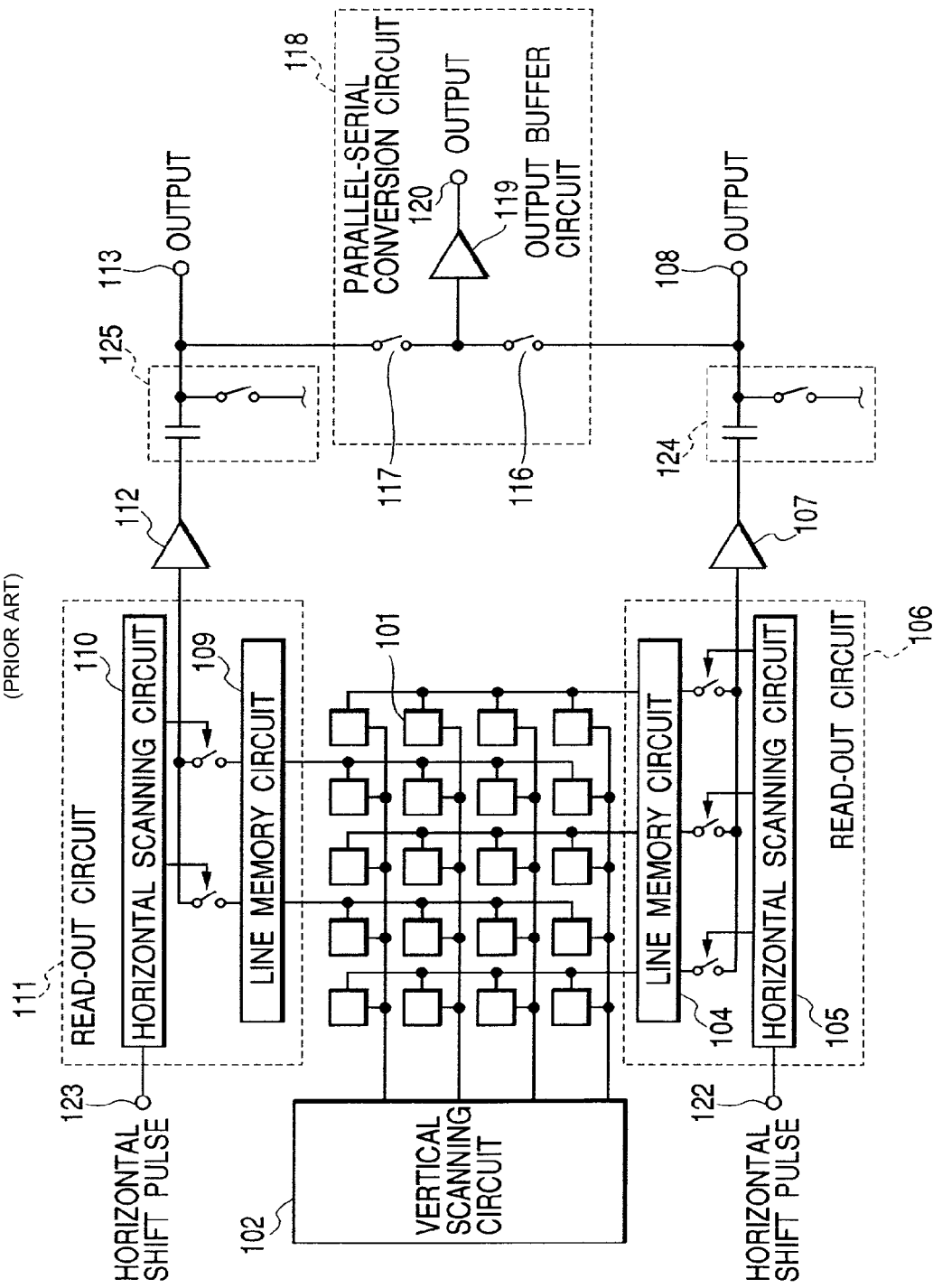
FIG. 1 is a circuit diagram showing a schematic arrangement of a conventional semiconductor solid-state image pickup device.
Figure 2:
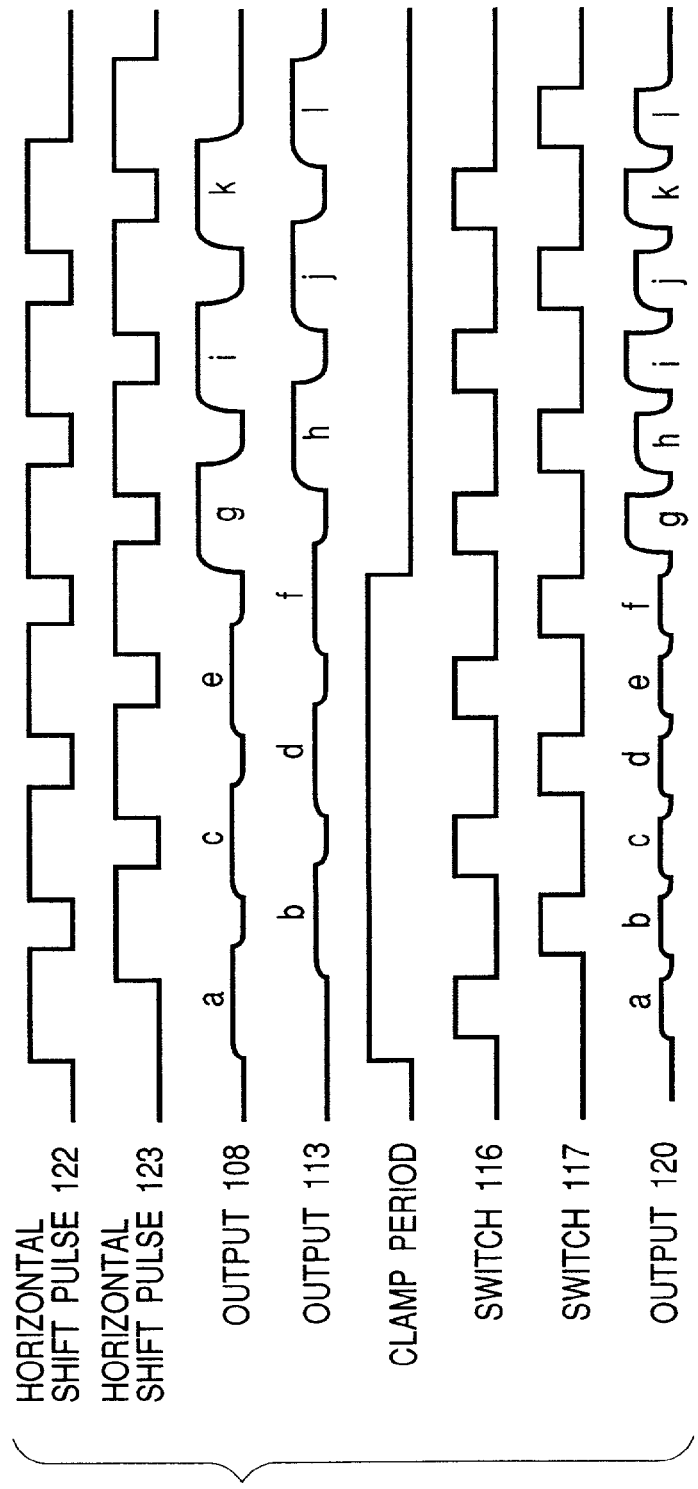
FIG. 2 is a timing chart showing wavelengths at the seven nodes of a horizontal shift pulse 122, horizontal shift pulse 123, output 108, output 113, switch 116, switch 117, and output 120, and a clamp period in which clamp operation for each read-out channel is done.
Figure 4:
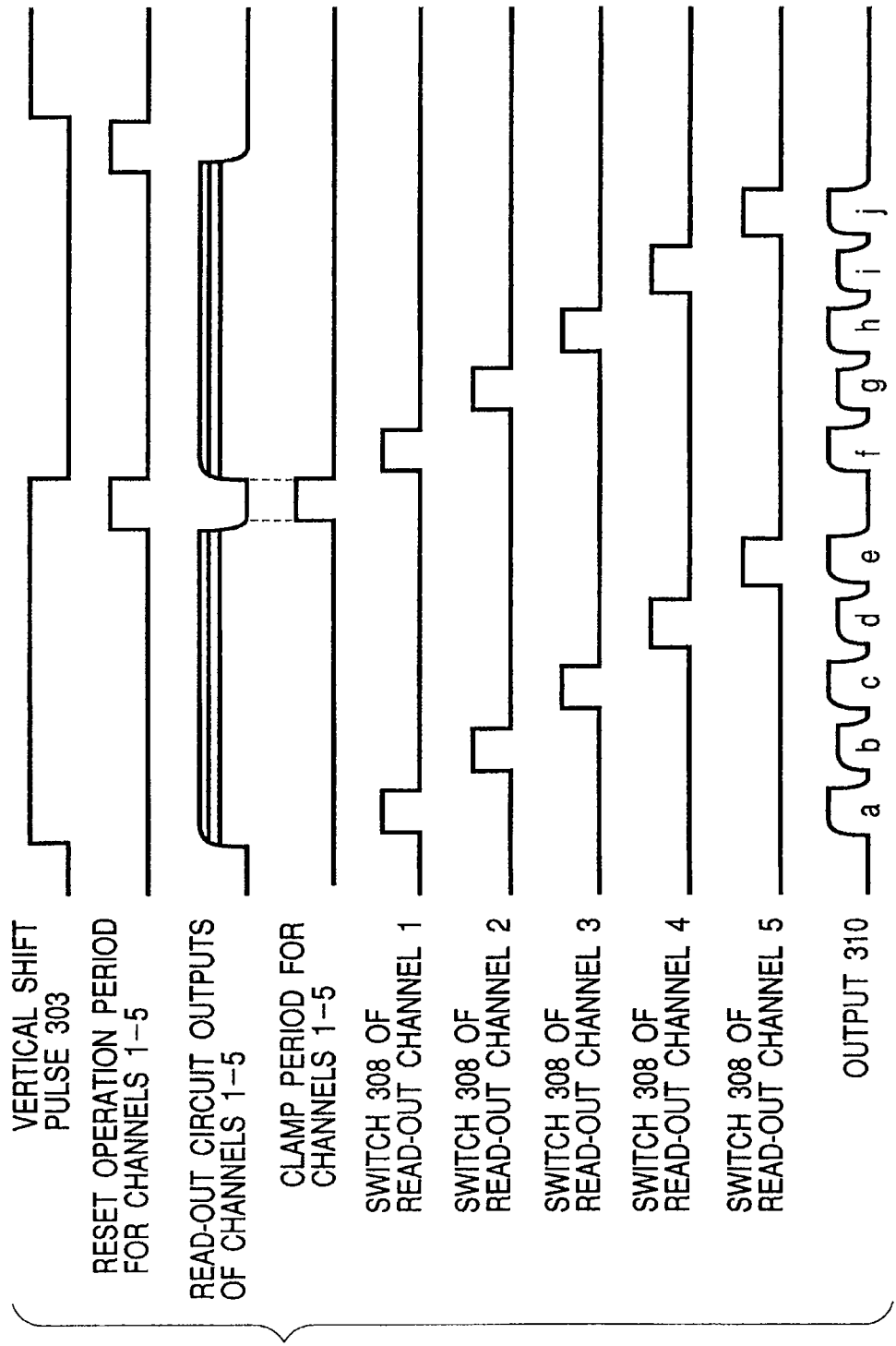
FIG. 4 is a timing chart showing wavelengths at seven nodes of a vertical shift pulse 303, switches 308 of read-out channels 1 to 5, and output 310 in the first, second, fourth to sixth, and eighth embodiments, a reset operation period for channels 1 to 5 in which reset operation for each read-out channel is done, read-out circuit outputs of channels 1 to 5, and a clamp period for channels 1 to 5 in which clamp operation is done.

FIG. 4 is a timing chart showing wavelengths at seven nodes of the vertical shift pulse 303, switches 308 of read-out channels 1 to 5, and output 310 in FIG. 1 according to the first embodiment, a reset operation period for channels 1 to 5 in which reset operation for each read-out channel is done, read-out circuit outputs of channels 1 to 5, and a clamp period for channels 1 to 5 in which clamp operation is done.

As shown in FIG. 4, a row to be selected is switched at the leading and trailing edges of the vertical shift pulse 303, the switches 308 are sequentially selected after row selection, and a series of pixel signals are output to the output 310. In clamp operation, the reset levels included in outputs from the read-out circuits are clamped by operating the clamp units while outputting the reset levels included in the pixel signals at the output 310 that are assigned a to e for the first row. Pixel signals on the second row output to the output 310 that are assigned f to j are output as high-quality image signals free from any offset error because these pixel signals have already undergone clamp operation.

In this manner, the clamp unit for removing an offset generated every read-out channel is arranged to clamp the reset level included in an output signal from the read-out circuit. This exhibits the following technological advantages.

(1) No OB pixel needs to be used.
(2) A period necessary for the clamp unit can be shortened.
(3) A stable clamp level can be supplied against variations in dark level caused by defective OB pixels, stray light, or the like.

The second embodiment according to the present invention will be described with reference to FIGS. 3, 5, and 6. The second embodiment is different from the first embodiment in that a clamp unit clamps the reset level included in an output signal from each read-out channel to an externally input reference voltage or internally generated reference voltage.

Figure 5:
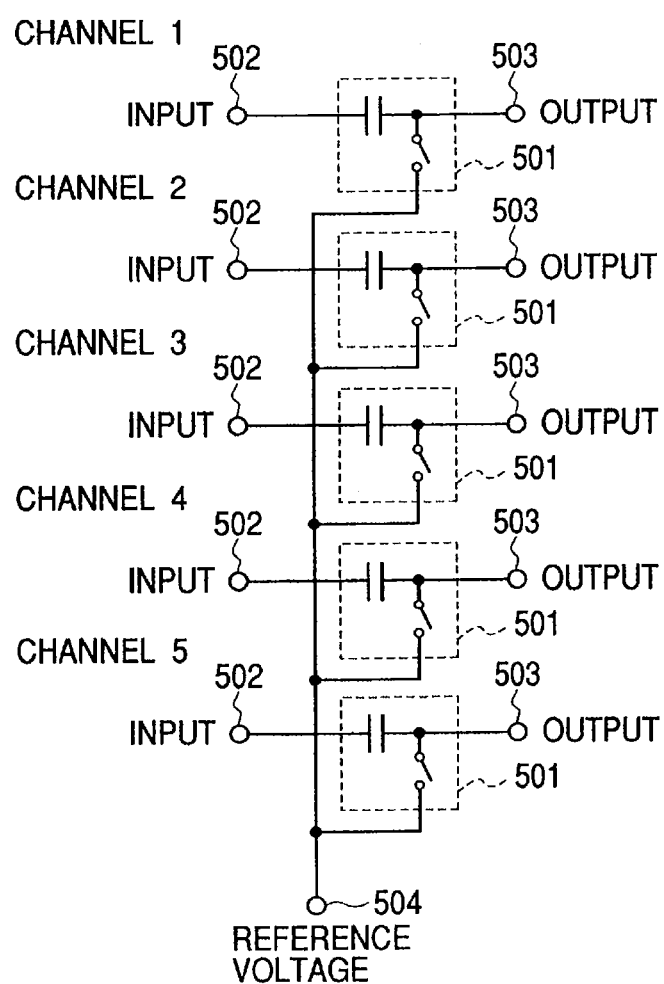
FIG. 5 is a circuit diagram showing clamp units in the second, fourth, 10th, and 12th embodiments of a semiconductor solid-state image pickup device according to the present invention.
Figure 6:
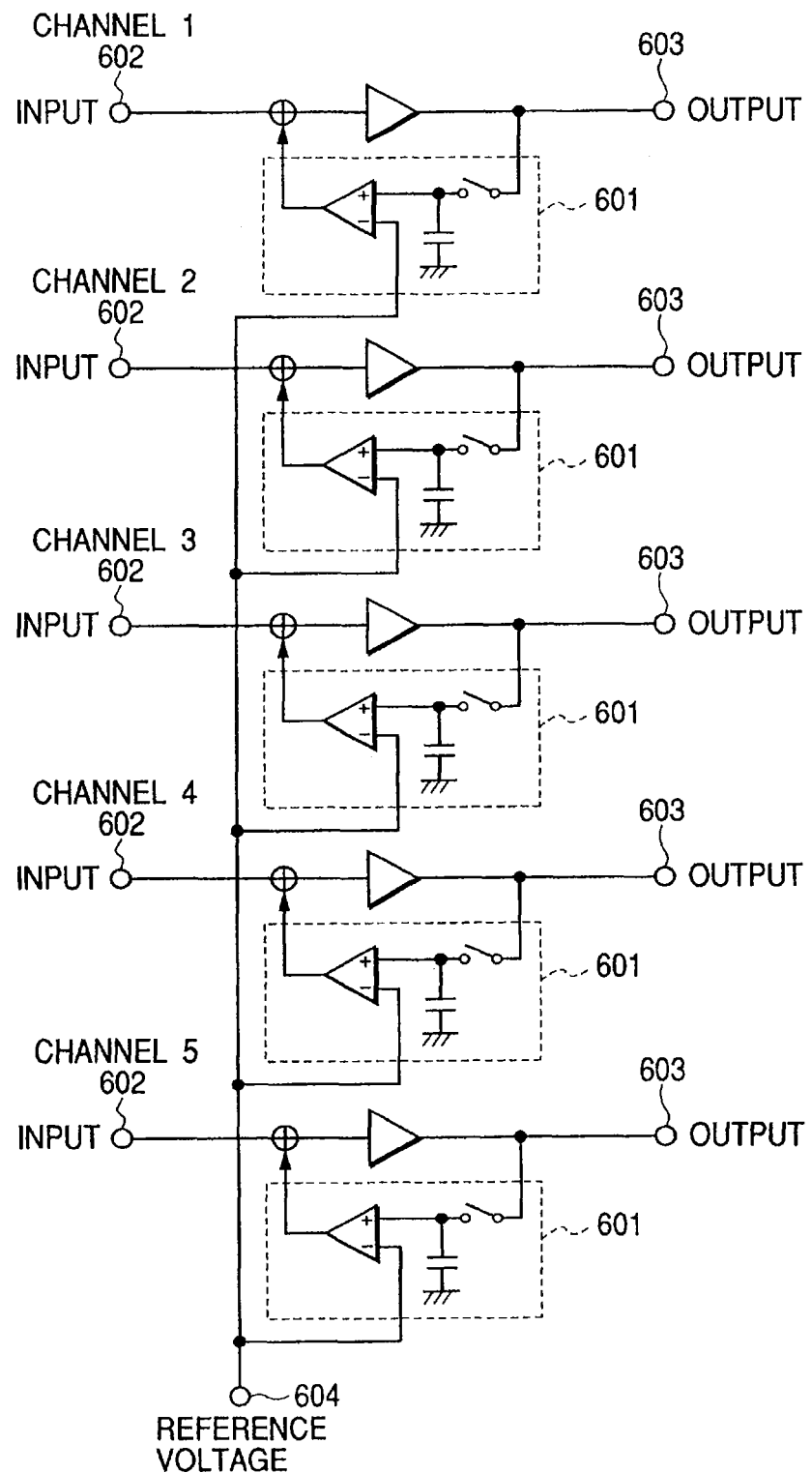
FIG. 6 is a circuit diagram showing clamp units in the second, fifth, 10th, and 13th embodiments of a semiconductor solid-state image pickup device according to the present invention.

FIGS. 5 and 6 are circuit diagrams showing clamp units according to the second embodiment. In FIG. 5 or 6, the reset level included in an output signal from each read-out channel is clamped to a reference voltage 504 or 604 commonly connected to clamp units 501 or 601.

Since the reset level is clamped to the applied reference voltage 504 or 604, appropriate signal processing can be realized by setting a voltage correlated to a reference voltage used for subsequent signal processing.

The third embodiment according to the present invention will be described with reference to FIGS. 3 and 7. The third embodiment is different from the second embodiment in that the average of the reset levels included in a plurality of output signals is clamped to a desired potential on each read-out channel.

Figure 7:
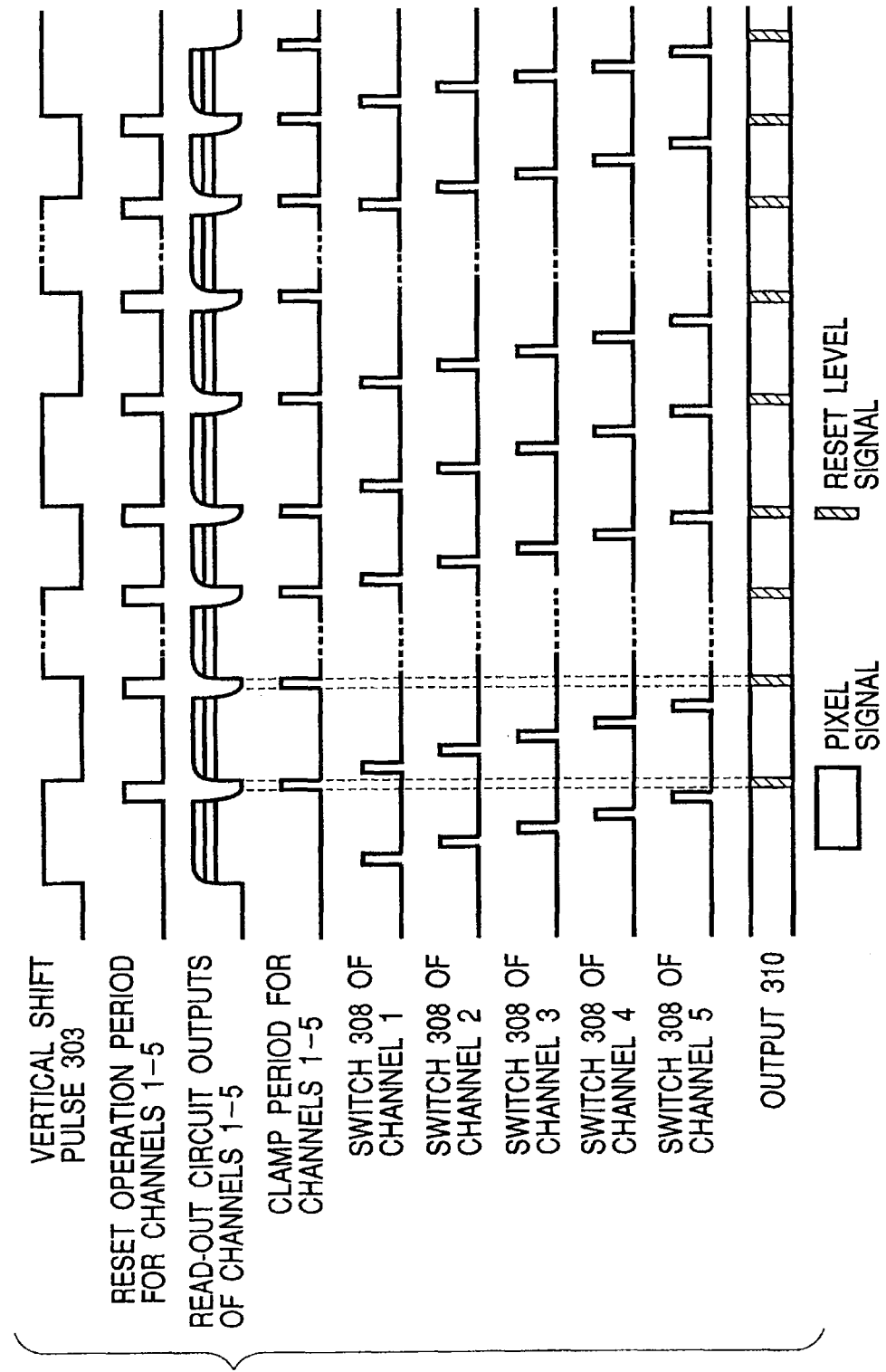
FIG. 7 is a timing chart showing wavelengths at seven nodes of a vertical shift pulse 303, switches 308 of channels 1 to 5, and output 310 in the third and seventh embodiments, a reset operation period for channels 1 to 5 in which reset operation for each read-out channel is done, read-out circuit outputs of channels 1 to 5, and a clamp period for channels 1 to 5 in which clamp operation is done.

FIG. 7 is a timing chart showing wavelengths at seven nodes of a vertical shift pulse 303, switches 308 of channels 1 to 5, and output 310 in FIG. 3 according to the third embodiment, a reset operation period for channels 1 to 5 in which reset operation for each read-out channel is done, read-out circuit outputs of channels 1 to 5, and a clamp period for channels 1 to 5 in which clamp operation is done.

As shown in FIG. 7, a clamp period is set for each reset operation period. The average of reset level signals can be attained from one read-out channel, and is clamped to each clamp unit. The reset level signal included in each read-out circuit output varies to a certain degree owing to noise generated in each block. A more ideal reset level signal can be attained by using the average of reset level signals obtained from a plurality of pixel signals.

The fourth embodiment according to the present invention will be described with reference to FIGS. 3, 5, and 8. The fourth embodiment exemplifies the first arrangement of the clamp units in the second and third embodiments.

Figure 8:
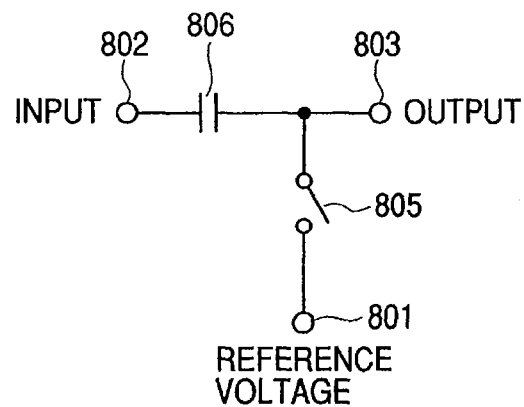
FIG. 8 is a circuit diagram showing one channel of a clamp unit in the fourth and 12th embodiments of a semiconductor solid-state image pickup device according to the present invention.

FIG. 8 is a circuit diagram showing one channel of a clamp unit according to the fourth embodiment. In FIG. 8, a coupling capacitor 806 which transfers only an AC component to the output stage is interposed between an input 802 and an output 803, and a switch 805 is interposed between the output terminal of the coupling capacitor 806 and a clamped reference voltage 801.

In clamp operation, when the reset level included in an output signal is supplied to the input 802, the switch 805 is turned on and then off. The coupling capacitor 806 holds charges generated by the potential difference between the reset level included in the output signal and the reference voltage 801. This realizes clamp. While the switch 805 is OFF, the impedance of the output 803 is set sufficiently high. The reset level included in the output signal coincides with the reference voltage without losing the charges held by clamp from the coupling capacitor 806. Then, subsequent pixel signals are output.

The fifth embodiment according to the present invention will be described with reference to FIGS. 3, 6, 9, and 10. The fifth embodiment exemplifies the second arrangement of the clamp units in the second and third embodiments.

Figure 9:
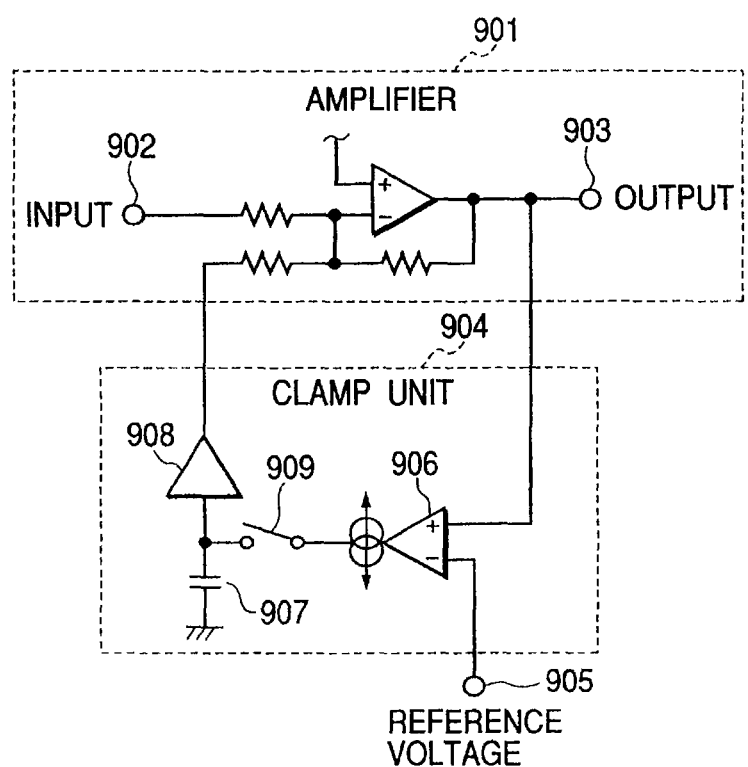
FIG. 9 is a first circuit diagram showing one channel of a clamp unit in the fifth and 13th embodiments of a semiconductor solid-state image pickup device according to the present invention.

FIG. 9 is a first circuit diagram showing one channel of a clamp unit according to the fifth embodiment. In FIG. 9, a clamp unit 904 forms a voltage feedback clamp unit whose offset amount is adjusted by feeding back an output voltage from an output 903 to the input.

An amplifier 901 adds two inputs, and uses an input 902 as one of the two inputs and a feedback voltage input as the other. The clamp unit 904 uses a transconductance amplifier 906 for converting the potential difference between a reference voltage 905 and the output 903 into a current value, and outputting the current value. The clamp unit 904 feeds back a voltage generated at a capacitor 907 connected to the output terminal of the transconductance amplifier 906 to the feedback voltage input via a buffer circuit 908.

In clamp operation, when the reset level included in an output signal from the output 903 is output, a switch 909 in the clamp unit 904 is turned on to form a negative feedback loop. When a signal output to the output 903 coincides with the reference voltage 905, the negative feedback loop stabilizes. At this time, the switch 909 is turned off to hold the offset amount as charges in the capacitor 907. Subsequently, pixel signals free from any offset signal are output.

Figure 10:
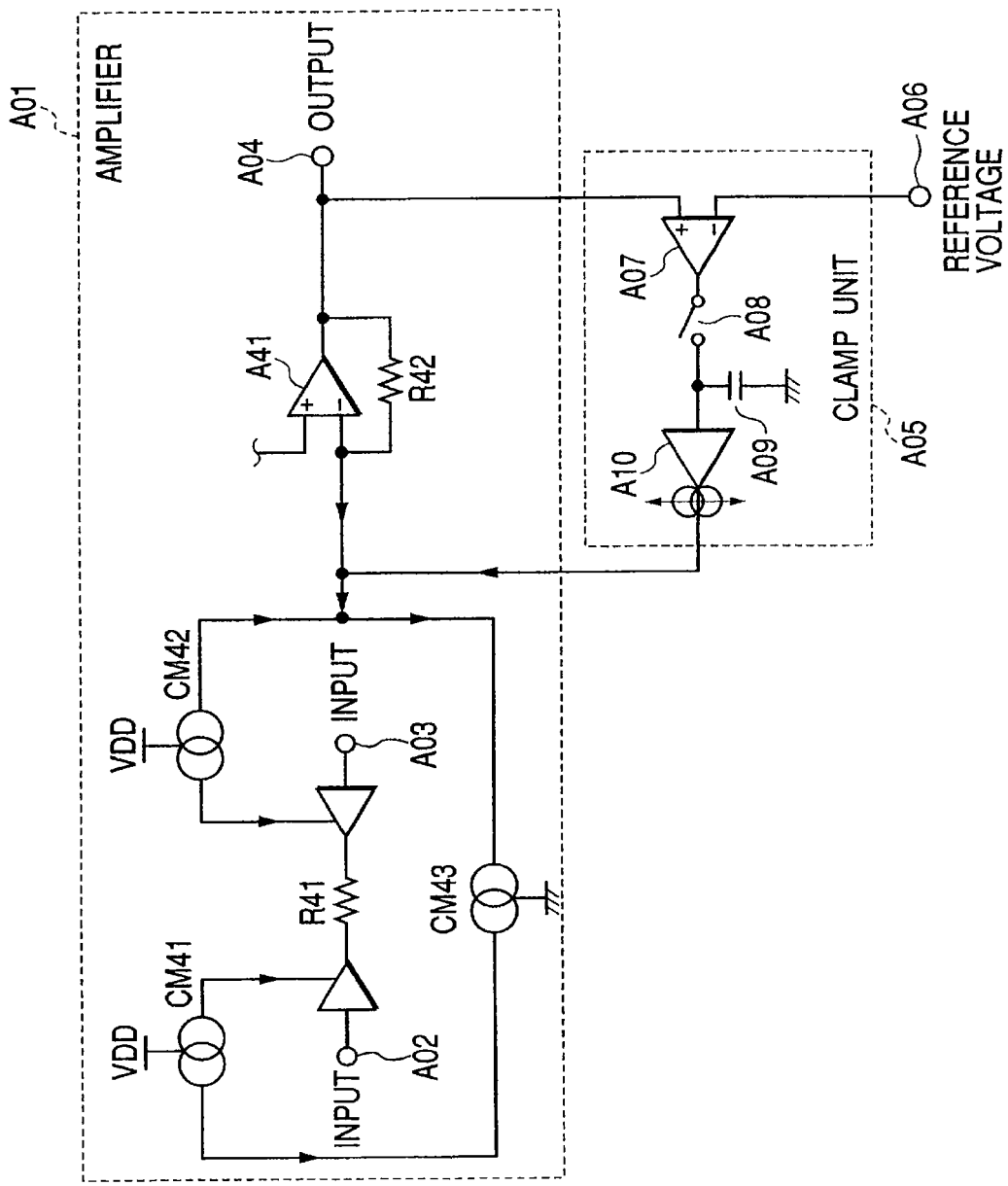
FIG. 10 is a second circuit diagram showing, one channel of the clamp unit in the fifth and 13th embodiments of a semiconductor solid-state image pickup device according to the present invention.

FIG. 10 is a second circuit diagram showing one channel of a clamp unit according to the fifth embodiment. In FIG. 10, a clamp unit A05 forms a current feedback clamp means A05 whose offset amount is adjusted by feeding back a current. An amplifier A01 transfers a current by a voltage-current conversion circuit which has a differential input structure of inputs A02 and A03, applies two input voltages to the two terminals of a resistor R41 via a buffer circuit, and converts two input voltages into a current by the resistor R41 and the differential voltage between the two inputs, and current mirror circuits CM41, CM42, and CM43 for transferring the output current. The amplifier A01 outputs the current to an output A04 via a current-voltage conversion circuit A41 for converting the current into a voltage by a resistor R42.

The clamp unit A05 has a comparator circuit A07 for comparing an output from the output A04 with a reference voltage A06, and a transconductance amplifier A10 whose output current is determined by an output voltage from the comparator circuit A07. An output from the clamp unit A05 is supplied to the input terminal of the current-voltage conversion circuit A41 included in the amplifier A01. In clamp operation, when the reset level included in an output signal from the output A04 is output, a switch in the clamp unit A05 is turned on to form a negative feedback loop.

When the output A04 coincides with the reference voltage A06, the negative feedback loop stabilizes. At this time, a switch A08 is turned off to hold the offset amount as charges in a capacitor A09 in the clamp unit A05. Subsequently, pixel signals free from any offset signal are output.

The sixth embodiment according to the present invention will be described with reference to FIGS. 3 and 11. Unlike the clamp unit of the first embodiment, the clamp unit of the sixth embodiment clamps a relative offset between the reset level included in an output signal of a specific read-out channel and the reset level included in an output signal of another read-out channel to the reset level included in the output signal of the specific read-out channel.

Figure 11:
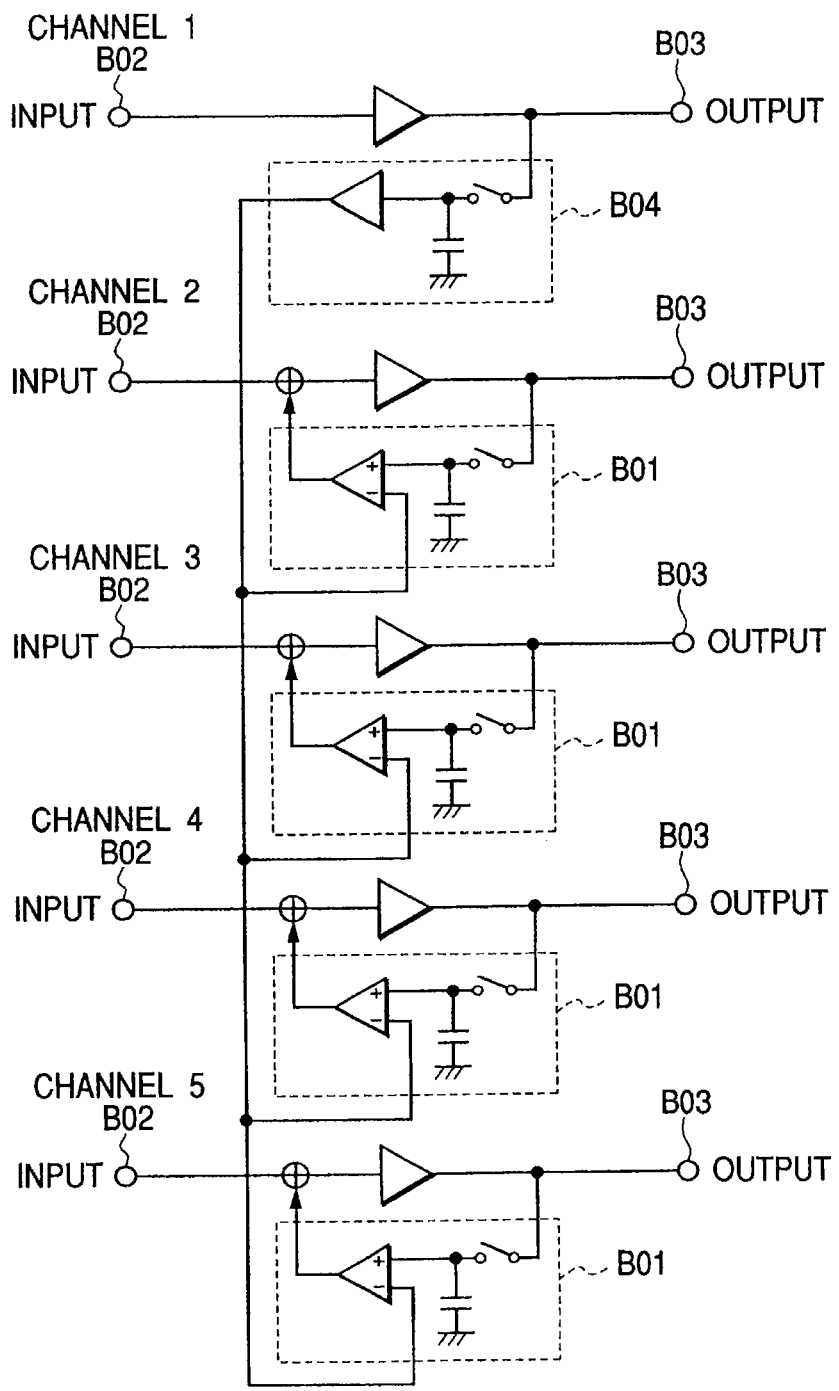
FIG. 11 is a circuit diagram showing clamp units in the sixth, eighth, 14th, and 16th embodiments of a semiconductor solid-state image pickup device according to the present invention.

FIG. 11 is a circuit diagram showing the clamp unit according to the sixth embodiment. In FIG. 11, the clamp unit forms a negative feedback clamp unit. Read-out channels 2 to 5 are respectively connected to clamp units B01. As for a read-out input B02 of channel 1, a sample-and-hold circuit B04 is connected to an output B03. In clamp operation, when the reset level included in an output signal is output to the output B03, the sample-and-hold circuit B04 samples the reset level included in the output signal from the output B03, and the reset level included in the sampled output signal is supplied as a reference voltage to the clamp unit B01.

As is apparent, in the sixth embodiment the clamp unit operates to make an output signal in clamp operation coincide with an applied reference voltage, so that read-out channels 2 to 5 operate to coincide with the reset level included in an output signal from read-out channel 1. Assuming that there are two read-out channels, the clamp precision is determined by only variations in one clamp unit. When clamp operation is independently performed, as described in the second embodiment, a clamp unit much superior to a case having variations in two clamp units can be provided.

The seventh embodiment according to the present invention will be described with reference to FIGS. 3, 7, and 11. The seventh embodiment is different from the sixth embodiment in that the reset level is the average of the reset levels included in a plurality of output signals.

The characteristic operation of the seventh embodiment has already been described in the third embodiment, and the technological advantages of the seventh embodiment are also the same as those of the third embodiment.

The eighth embodiment according to the present invention will be described with reference to FIGS. 3, 4, and 11. The eighth embodiment is different from the sixth and seventh embodiments in that the clamp unit is a negative feedback clamp unit for adjusting the operating point of an amplifier.

The characteristic operation of the eighth embodiment has already been described in the fifth embodiment, and the technological advantages of the eighth embodiment are also the same as those of the fifth embodiment.

Figure 12:
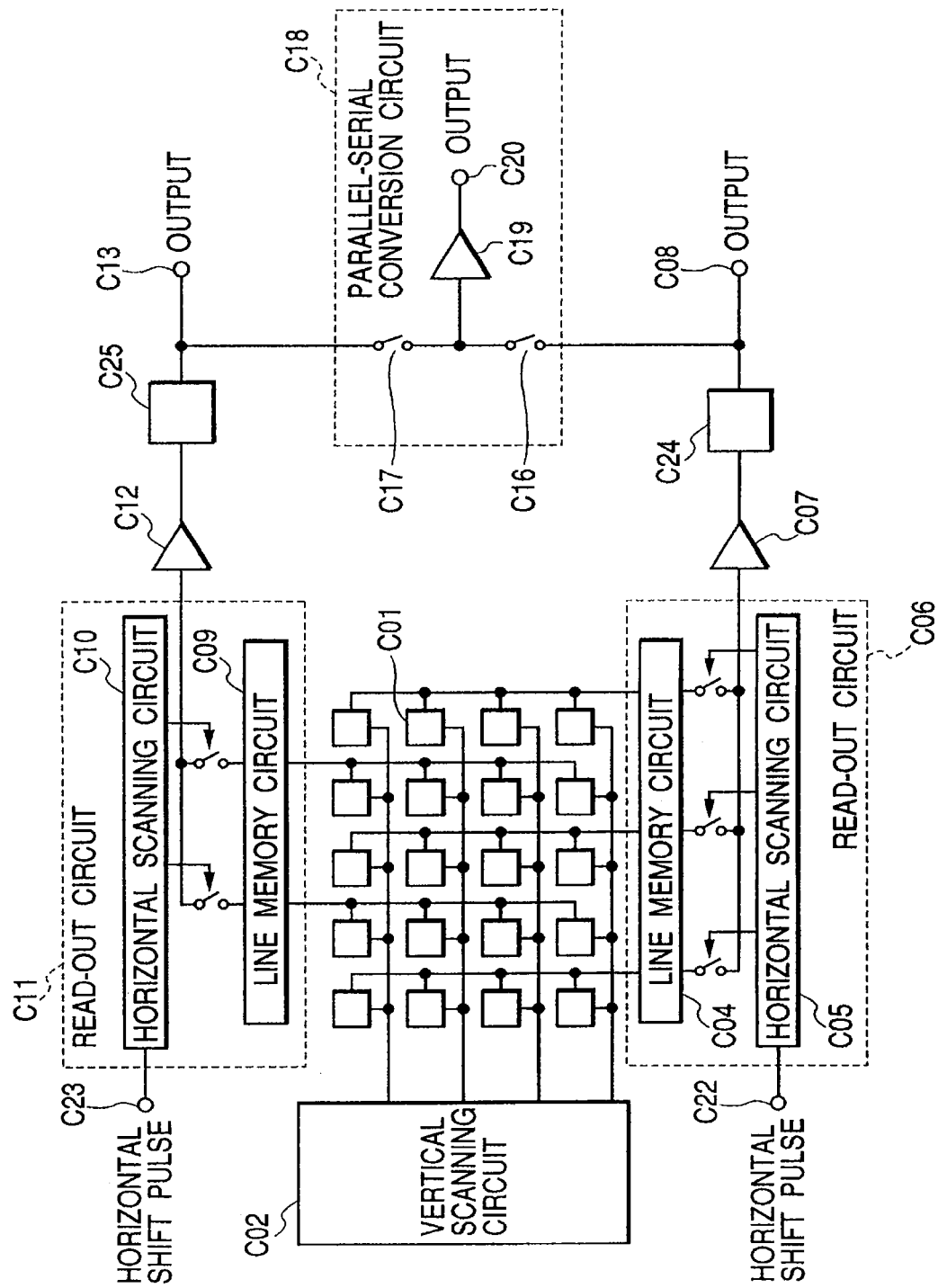
FIG. 12 is a circuit diagram schematically showing the ninth to 16th embodiments of a solid-state image pickup device according to the present invention.

The ninth embodiment according to the present invention will be described with reference to FIGS. 12 and 13. FIG. 12 is a circuit diagram showing the schematic arrangement of a solid-state image pickup device formed on a single semiconductor substrate according to the ninth embodiment. In FIG. 12, two-dimensionally arrayed pixels C01 generate electrical signals, i.e., so-called pixel signals corresponding to incident light quantities. A pixel signal is read out by selecting a given row by a vertical scanning circuit C02, reading out pixel signals of odd-numbered pixels on the row to a line memory circuit C04, and reading out signals of even-numbered pixels on the row to a line memory circuit C09. A horizontal scanning circuit C05 sequentially selects pixel signals read out to the line memory circuit C04 in accordance with a horizontal shift pulse C22 externally or internally input in the chip. The selected pixel signals are amplified by an amplifier C26, and output via an output C08.

A horizontal scanning circuit C10 sequentially selects pixel signals read out to the line memory circuit C09 in accordance with a horizontal shift pulse C23 externally or internally input in the chip. The selected pixel signals are amplified by an amplifier C27, and output via an output C13.

One terminal of a switch C16 is connected to the terminal of the output C08, whereas one terminal of a switch C17 is connected to the terminal of the output C13. The other terminal of the switch C16 is connected to that of the switch C17. The switches C16 and C17 are alternately selected to output a series of pixel signals from an output C20.

Read-out circuits C06 and C11 reset pixel signals to prevent mixing of pixel signals such as an afterimage every time sequentially read-out pixel signals are transferred to the subsequent amplifiers C26 and C27. The reset voltage is externally input or internally generated, and a reset level including only the offset of the read-out channel is output without any influence of the pixel signal.

The reset level included in an output signal output to the output C08 is clamped to a desired potential using a clamp unit C24. The reset level included in an output signal output to the output C13 is clamped to a desired potential using a clamp unit C25.

If the potentials clamped by the clamp units C24 and C25 are the same, an output signal free from any offset can be obtained from the output C20.

Figure 13:
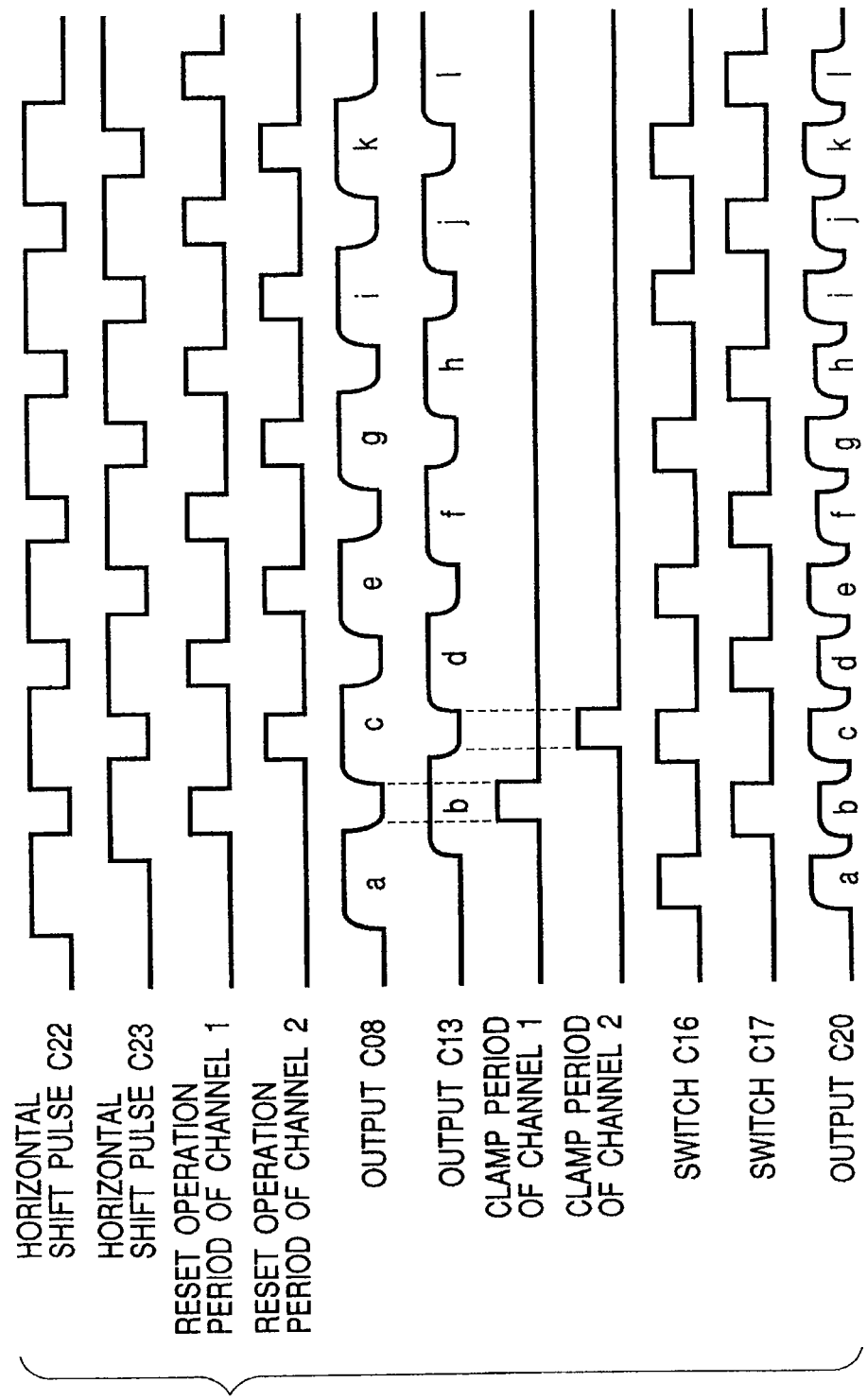
FIG. 13 is a timing chart showing wavelengths at seven nodes of a vertical shift pulse C22, horizontal shift pulse C23, output C08, output C13, switch C16, switch C17, and output C20 in the ninth to 16th embodiments shown in FIG. 12, reset operation periods of channels 1 and 2 in which reset operation for each read-out channel is done, and clamp periods of channels 1 and 2 in which clamp operation is done.

FIG. 13 is a timing chart showing wavelengths at the seven nodes of the vertical shift pulse C22, horizontal shift pulse C23, output C08, output C13, switch C16, switch C17, and output C18 in FIG. 12, reset operation periods of channels 1 and 2 in which reset operation for each read-out channel is done, and clamp periods of channels 1 and 2 in which clamp operation is done.

FIG. 13 shows a wavelength for six clocks of each of the horizontal shift pulses C22 and C23 respectively input to the horizontal scanning circuits C05 and C10. Timings corresponding to pixel signals of pixels from the first row to the 12th row are assigned a to l. In clamp operation, the reset levels included in outputs from the read-out circuits are clamped by operating the clamp units while outputting the reset levels included in the pixel signals a and b. Pixel signals on the second row output to the output C20 that are assigned c to l are output as high-quality image signals free from any offset error because these pixel signals have already undergone clamp operation.

As described above, the clamp unit for removing an offset generated every read-out channel is arranged to clamp the reset level included in an output signal from the read-out circuit. This exhibits the following technological advantages.

(1) No OB pixel needs to be used.
(2) A period necessary for the clamp unit can be shortened.
(3) A stable clamp level can be supplied against variations in dark level caused by defective OB pixels, stray light, or the like.

The 10th embodiment according to the present invention will be described with reference to FIGS. 5, 6, and 12. The 10th embodiment is different from the ninth embodiment in that a clamp unit clamps the reset level included in an output signal from each read-out channel to an externally input reference voltage or internally generated reference voltage.

The characteristic operation of the 10th embodiment has already been described in the second embodiment, and the technological advantages of the 10th embodiment are also the same as those of the second embodiment.

Figure 14:
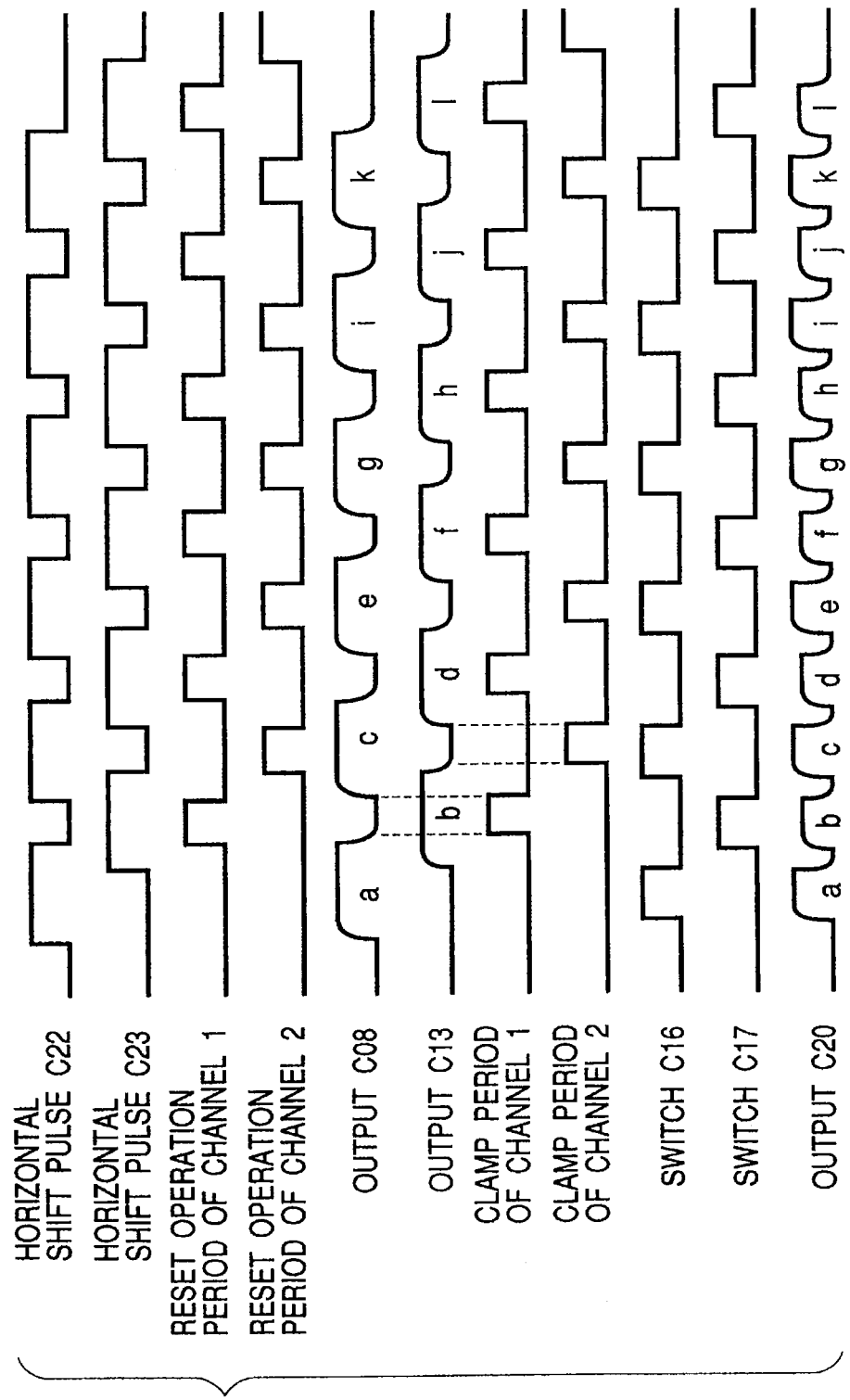
FIG. 14 is a timing chart showing wavelengths at seven nodes of a vertical shift pulse C22, horizontal shift pulse C23, output C08, output C13, switch C16, switch C17, and output C20 in the 11th and 15th embodiments shown in FIG. 12, reset operation periods of channels 1 and 2 in which reset operation for each read-out channel is done, and clamp periods of channels 1 and 2 in which clamp operation is done.

The 11th embodiment according to the present invention will be described with reference to FIGS. 12 and 14. The 11th embodiment is different from the 10th embodiment in that the average of the reset levels included in a plurality of output signals is clamped to a desired potential on each read-out channel.

The characteristic operation of the 11th embodiment has already been described in the third embodiment, and the technological advantages of the 11th embodiment are also the same as those of the third embodiment.

The 12th embodiment according to the present invention will be described with reference to FIGS. 5, 7, and 12. The 12th embodiment exemplifies the first arrangement of the clamp units in the 10th and 11th embodiments.

The characteristic operation of the 12th embodiment has already been described in the fourth embodiment, and the technological advantages of the 12th embodiment are also the same as those of the fourth embodiment.

The 13th embodiment according to the present invention will be described with reference to FIGS. 6, 9, 10, and 12. The 13th embodiment exemplifies the second arrangement of the clamp units in the 10th and 11th embodiments.

The characteristic operation of the 13th embodiment has already been described in the fifth embodiment, and the technological advantages of the 13th embodiment are also the same as those of the fifth embodiment.

The 14th embodiment according to the present invention will be described with reference to FIGS. 11 and 12. Unlike the clamp unit of the ninth embodiment, the clamp unit of the 14th embodiment clamps a relative offset between the reset level included in an output signal of a specific read-out channel and the reset level included in an output signal of another read-out channel to the reset level included in the output signal of the specific read-out channel.

The characteristic operation of the 14th embodiment has already been described in the sixth embodiment, and the technological advantages of the 14th embodiment are also the same as those of the sixth embodiment.

The 15th embodiment according to the present invention will be described with reference to FIGS. 7, 11, and 12. The 15th embodiment is different from the 14th embodiment in that the reset level is the average of the reset levels included in a plurality of output signals.

The characteristic operation of the 15th embodiment has already been described in the third embodiment, and the technological advantages of the 15th embodiment are also the same as those of the third embodiment.

The 16th embodiment according to the present invention will be described with reference to FIGS. 4, 11, and 12. The 16th embodiment is different from the 14th and 15th embodiments in that the clamp unit is a negative feedback clamp unit for adjusting the operating point of an amplifier.

The characteristic operation of the 16th embodiment has already been described in the fifth embodiment, and the technological advantages of the 16th embodiment are also the same as those of the fifth embodiment.

The 17th embodiment according to the present invention will be described with reference to FIGS. 10 and 15. The 17th embodiment is different from the first to ninth embodiments in that the amplifier amplifies the difference between two input signals and the clamp unit clamps the output signal.

Figure 15:
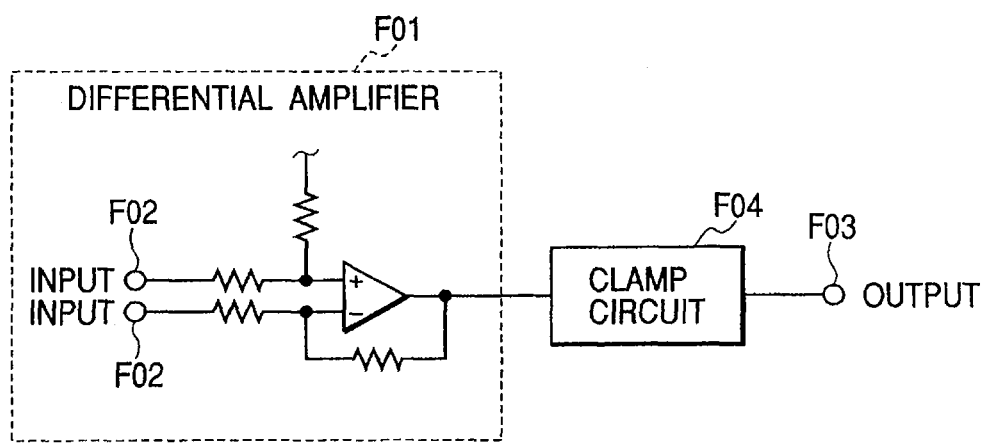
FIG. 15 is a second circuit diagram showing a differential amplifier in the 17th embodiment of a semiconductor solid-state image pickup device according to the present invention.

The amplifier A01 shown in FIG. 10 and the differential amplifier F01 shown in FIG. 15 have the first and second arrangements for explaining a differential amplifier F01 of the 17th embodiment.

The differential amplifier F01 extracts the potential difference between signals input to inputs 1 and 2, amplifies the potential difference in accordance with a set gain, and outputs the amplified potential difference. The clamp unit removes an offset generated in the differential amplifier.

In a semiconductor solid-state image pickup device with a plurality of pixels as described in the present invention, pixels include different noise signals, and even if the same light quantity is incident, the signal levels from the pixels are output with variation. To prevent this, optical signals to the two inputs of a differential amplifier, and a noise signal are input to a clamp unit to remove the offset. Thus, pixels which receive the same light quantity can output a predetermined signal level without any influence of different noise signals between pixels.

As has been described above, according to the first to 17th embodiments, a clamp unit for removing an offset generated every read-out channel is arranged to clamp the reset level included in an output signal from the read-out circuit. This exhibits the following technological advantages.

(1) No OB pixel needs to be used.
(2) A period necessary for the clamp unit can be shortened.
(3) A stable clamp level can be supplied against variations in dark level caused by defective OB pixels, stray light, or the like.

The 18th embodiment when the solid-state image pickup device described in any one of the first to 17th embodiments is applied to a still camera (image pickup apparatus) will be described in detail with reference to FIG. 16.

Figure 16:
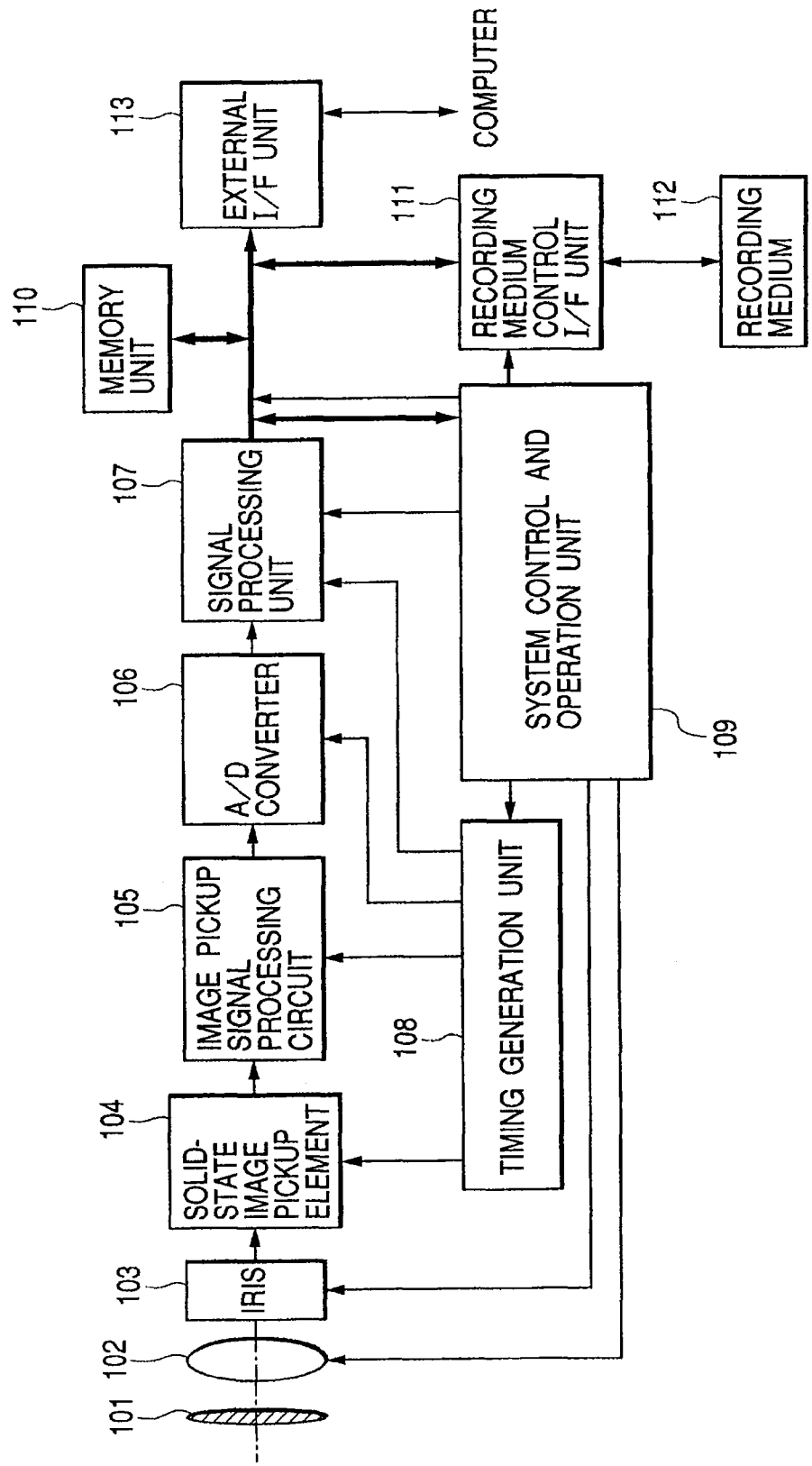
FIG. 16 is a block diagram showing a still camera (image pickup apparatus) using the solid-state image pickup device according to each of the first to 17th embodiments.

In FIG. 16, a barrier 101 serves as both a lens protector and main switch. A lens 102 forms an optical image of an object on a solid-state image pickup device 104. An iris 103 varies the light quantity having passed through the lens 102. The solid-state image pickup device 104 captures the object image formed on the lens 102 as an image signal. An A/D converter 106 analog-to-digital-converts the image signal output from the solid-state image pickup device 104. A signal processing unit 107 executes various correction processes for the image data output from the A/D converter 106, or compresses data. A timing generation unit 108 outputs various timing signals to the solid-state image pickup device 104, an image pickup signal processing circuit 105, the A/D converter 106, and the signal processing unit 107. A system control and operation unit 109 controls various operations and the whole still camera. A memory unit 110 temporarily stores image data. An I/F unit 111 is used to record/read out data on/from a recording medium. Image data is recorded/read out on/from a detachable recording medium 112 such as a semiconductor memory. An I/F unit 113 is used to communicate with an external computer or the like.

The operation of the still camera in image pickup with the above arrangement will be explained.

When the barrier 101 is opened, the main power supply is turned on, the power supply of the control system is turned on, and the power supply of the image pickup system circuit including the A/D converter 106 is turned on.

To control the exposure amount, the system control and operation unit 109 sets the iris 103 to a full-aperture state. A signal output from the solid-state image pickup device 104 is converted by the A/D converter 106, and input to the signal processing unit 107. The system control and operation unit 109 calculates the exposure amount on the basis of the data.

The brightness is determined from the results of photometry, and the system control and operation unit 109 controls the iris in accordance with the results.

A high-frequency component is extracted from the signal output from the solid-state image pickup device 104, and the system control and operation unit 109 calculates the distance to the object. The lens is driven to check whether the image is in focus or not. If the image is out of focus, the lens is driven again to measure the distance.

After an in-focus state is confirmed, actual exposure starts.

After exposure, an image signal output from the solid-state image pickup device 104 is A/D-converted by the A/D converter 106, and written in the memory unit by the system control and operation unit 109 via the signal processing unit 107.

Data accumulated in the memory unit 110 are recorded on the detachable recording medium 112 such as a semiconductor memory via the recording medium control I/F unit under the control of the system control and operation unit 109.

Data may be directly input to a computer or the like via the external I/F unit 113 to process an image.

Many widely different embodiments of the present invention may be constructed without departing from the spirit and scope of the present invention. It should be understood that the present invention is not limited to the specific embodiments described in the specification, except as defined in the appended claims.

What is claimed is:

1. A solid-state imaging apparatus comprising:
   a plurality of pixels arranged along rows and columns; and
   a plurality of read out channels, each arranged correspondingly to one of the columns, for reading out a signal from the plurality of pixels, and
   a plurality of switches each corresponding to a respective one of the plurality of read out channels, for reading out the signal from each of the plurality of read out channels to a common output node;
   wherein each of the plurality of read out channels includes:
   a correlation double sampling circuit for receiving the signal read out from the plurality of pixels and reducing a noise contained in the signal;
   an amplifier for amplifying the signal of which noise is reduced by the correlated double sampling circuit; and
   an offset removing unit which includes a clamp unit, the offset removing unit for subjecting a signal outputted through the amplifier to an offset correction processing.

2. The solid-state imaging apparatus according to claim 1, wherein each of the plurality of pixels has a color filter.

3. The solid-state imaging apparatus according to claim 1, wherein the clamp unit clamps a reset level included in the signal outputted through the amplifier to a reference voltage.

4. The solid-state imaging apparatus according to claim 1, wherein the clamp unit comprises a voltage feedback clamp unit of which offset is adjusted by a feedback an output to an input of the voltage feedback clamp unit.

5. The solid-state imaging apparatus according to claim 1, wherein the clamp unit comprises a negative feedback clamp unit.

* * * * *